(12) United States Patent
Tan

(10) Patent No.: US 8,492,873 B1
(45) Date of Patent: Jul. 23, 2013

(54) INTEGRATED CIRCUIT GUARD RING STRUCTURES

(75) Inventor: Chee Hong Tan, Sungai Ara (MY)

(73) Assignee: Altera Corporation, San Jose, CA (US)

( * ) Notice: Subject to any disclaimer, the term of this patent is extended or adjusted under 35 U.S.C. 154(b) by 366 days.

(21) Appl. No.: 12/717,796

(22) Filed: Mar. 4, 2010

(51) Int. Cl.
*H01L 21/02* (2006.01)
*H01L 29/06* (2006.01)

(52) U.S. Cl.
USPC .............. 257/532; 257/490; 257/E27.048

(58) Field of Classification Search
USPC ........... 257/452, 296, 484, 490, 491, 494, 257/495, 409, 516, 528, 532, E27.016, E27.025, 257/E27.048
See application file for complete search history.

(56) References Cited

U.S. PATENT DOCUMENTS

| 5,375,083 | A | | 12/1994 | Yamaguchi |
| 5,801,411 | A | | 9/1998 | Klughart |
| 5,883,423 | A | * | 3/1999 | Patwa et al. .................... 257/532 |
| 5,946,259 | A | | 8/1999 | Manning et al. |
| 5,998,846 | A | | 12/1999 | Jan et al. |
| 6,303,957 | B1 | | 10/2001 | Ohwa |
| 6,509,622 | B1 | | 1/2003 | Ma et al. |
| 7,009,228 | B1 | | 3/2006 | Yu |
| 7,247,543 | B2 | | 7/2007 | Shih et al. |
| 7,541,652 | B1 | * | 6/2009 | Abughazaleh ................. 257/372 |
| 2005/0189602 | A1 | | 9/2005 | Yamamoto et al. |
| 2005/0232053 | A1 | * | 10/2005 | Azuma et al. .................. 365/226 |
| 2006/0267132 | A1 | * | 11/2006 | Lee ................................ 257/509 |
| 2007/0241422 | A1 | * | 10/2007 | Chen ............................. 257/528 |
| 2008/0273286 | A1 | * | 11/2008 | Kang .......................... 361/301.4 |
| 2009/0101937 | A1 | * | 4/2009 | Lee et al. ...................... 257/137 |

FOREIGN PATENT DOCUMENTS

JP 2000049286 A 2/2000

* cited by examiner

*Primary Examiner* — Matthew Landau
*Assistant Examiner* — Khaja Ahmad
(74) *Attorney, Agent, or Firm* — Treyz Law Group; David C. Kellogg

(57) ABSTRACT

An integrated circuit is provided with guard rings that form ring-like reverse-biased p-n junctions around circuitry. Capacitors may be integrated into the guard rings. Power supply lines may be connected to the guard rings and the capacitors. The capacitors may stabilize power supply voltages on the power supply lines. The power supply lines may be arranged such that they are parallel to each other. The power supply lines can form one or more parallel plate capacitors that stabilize the power supply voltages on the power supply lines.

26 Claims, 13 Drawing Sheets

INTEGRATED CIRCUIT GUARD RING STRUCTURES

BACKGROUND

This invention relates to integrated circuits such as programmable logic device integrated circuits, and more particularly, to guard ring structures for programmable logic devices and other integrated circuits.

Integrated circuits often contain multiple sections of circuitry. Each section produces noise that could potentially interfere with the operation of nearby sections. It is therefore often desirable to isolate sections of circuitry to reduce the propagation of noise. Traditional techniques for isolating sections of circuitry on an integrated circuit include using guard rings to reduce the propagation of noise between sections of circuitry.

Some traditional integrated circuits also contain power decoupling capacitors that stabilize power supply voltages in the integrated circuits. These capacitors tend to be bulky, however, leading to underside consumption of available area on an integrated circuit.

SUMMARY

Guard ring structures are provided that may include integrated capacitors. The guard ring structures may include alternating power tracks.

Guard rings may include a well in a substrate and relatively highly-doped regions within that well that are connected to a power supply voltage. With the power supply voltage, the well and the substrate form a reverse-biased p-n junction that surrounds and protects circuitry from electrical noise.

Capacitors formed from transistors with source-drain terminals that are connected together may also be formed in the well of a guard ring. The capacitors may be surrounded by the highly-doped regions. The well may be interposed between the capacitors and the highly-doped regions. The capacitors may have a pair of terminals each of which is connected to a different power supply voltage. The capacitors may stabilize the power supply voltages by resisting sudden changes to the power supply voltages.

The guard rings may include alternating power supply lines connected to the highly-doped regions and the capacitors. The power supply lines may provide ground and positive power supply voltages to the highly-doped regions and the capacitors. With one suitable arrangement, the alternating power supply lines may be arranged in a ring-like concentric pattern such that the power supply lines form one or more parallel-plate capacitors. Because the terminals of such a parallel-plate capacitor are at the positive and ground power supply voltages, the parallel-plate capacitor helps to stabilize the power supply voltages.

Because capacitors can be integrated into a guard ring and because of the additional capacitance provided by alternating power supply lines in the guard ring, the amount of area outside of the guard ring consumed by power decoupling transistors is reduced, especially within a core logic area inside the guard ring.

Further features of the invention, its nature, and various advantages will be more apparent from the accompanying drawings and the following detailed description.

DETAILED DESCRIPTION

This relates to guard rings. The guard rings may be used on any suitable integrated circuits such as digital signal processors, microprocessors, application-specific integrated circuits, programmable circuits, etc.

Components such as capacitors may be integrated into one or more guard rings in an integrated circuit. For example, power decoupling capacitors may be integrated into the guard rings of the integrated circuit. The guard rings may include concentric power tracks of alternating polarity (i.e., ground power supply tracks and positive power supply tracks).

The power decoupling capacitors and the alternating power tracks may provide a capacitance that helps to reduce fluctuations (i.e., jitter) in the power supply voltages in the integrated circuit (e.g., the power decoupling capacitors and alternating power tracks may both contribute to power stability). In addition, the use of capacitors that are integrated into guard rings may increase the available circuit area in an integrated circuit.

If desired, an integrated circuit may include guard rings that include alternating power tracks but that do not include integrated capacitors. Integrated circuits may also be provided that include guard rings that include integrated capacitors (or other components) but that do not include alternating power tracks. Different regions of a given integrated circuit may be provided with guard rings of different types.

Figure 1:
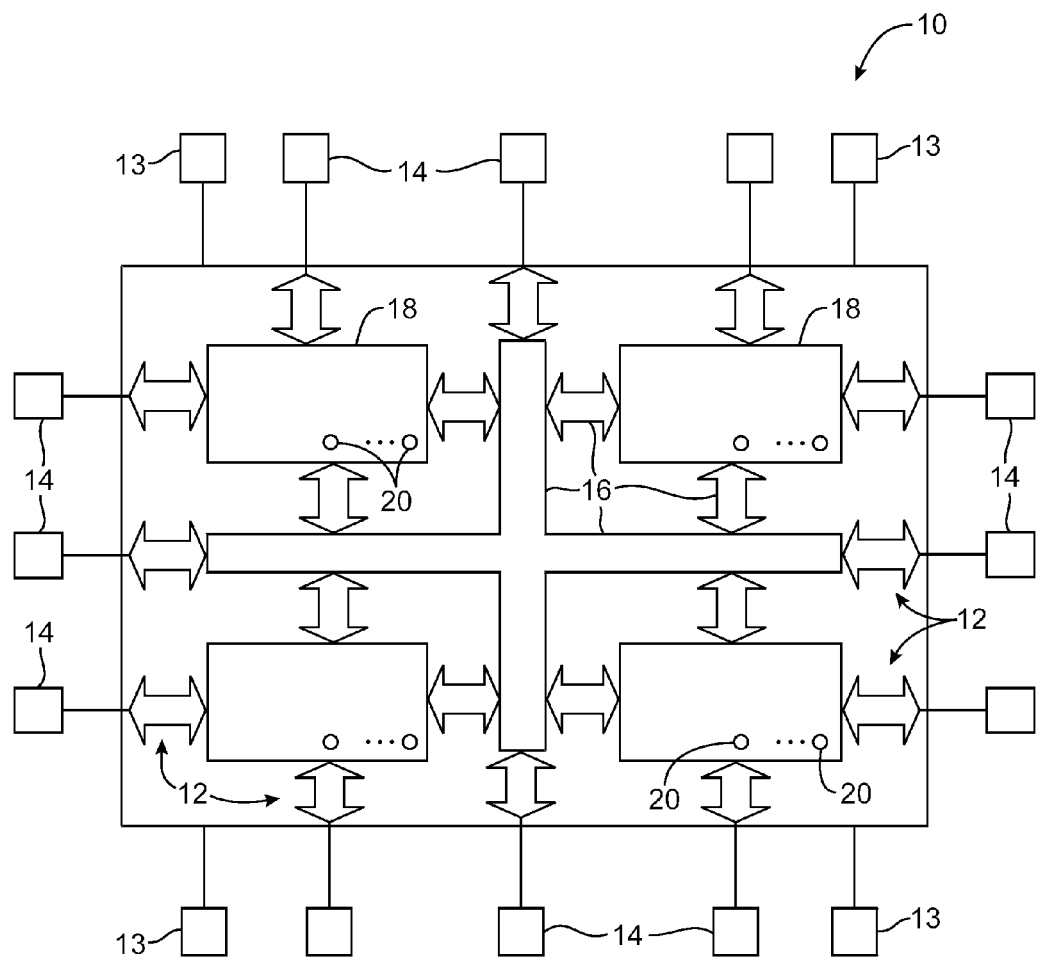
FIG. 1 is a schematic diagram of an illustrative integrated circuit that may include guard rings in accordance with an embodiment of the present invention.

An illustrative integrated circuit 10 in accordance with the present invention is shown in FIG. 1. As examples, integrated circuit 10 may be a digital signal processor, a microprocessor, an application-specific integrated circuit, a programmable circuit such as a programmable logic device, or other suitable integrated circuit.

Integrated circuit 10 may have input/output circuitry 12 for driving signals off of device 10 and for receiving signals from other devices via input/output data pins 14. Power supply pins such as pins 13 may be used to provide power supply signals to device 10. Interconnection resources 16 such as vertical and horizontal conductive lines may be used to route signals on device 10.

Integrated circuit 10 may have circuitry 18 (sometimes referred to as "logic" or "core logic"). Circuitry 18 may include combinational and sequential logic circuitry. The circuitry of device 10 such as circuitry 18, interconnection resources 16, and I/O circuitry 12 may include hardwired circuitry and/or programmable logic that may be customized ("programmed") by a user to perform a desired custom logic function.

In integrated circuits that include programmable circuitry, the programmable circuitry may be based on any suitable programmable technology. With one suitable approach, configuration data (also called programming data) may be loaded into programmable elements on device 10 using pins 14 and input/output circuitry 12. In the example of FIG. 1, a number of illustrative programmable elements 20 are shown. In general, there may be numerous elements 20 on a given device. The programmable elements 20 (also sometimes called configuration bits or programmable function control elements) may each provide a static control output signal that controls the state of an associated logic component in integrated circuit 10.

Figure 2:
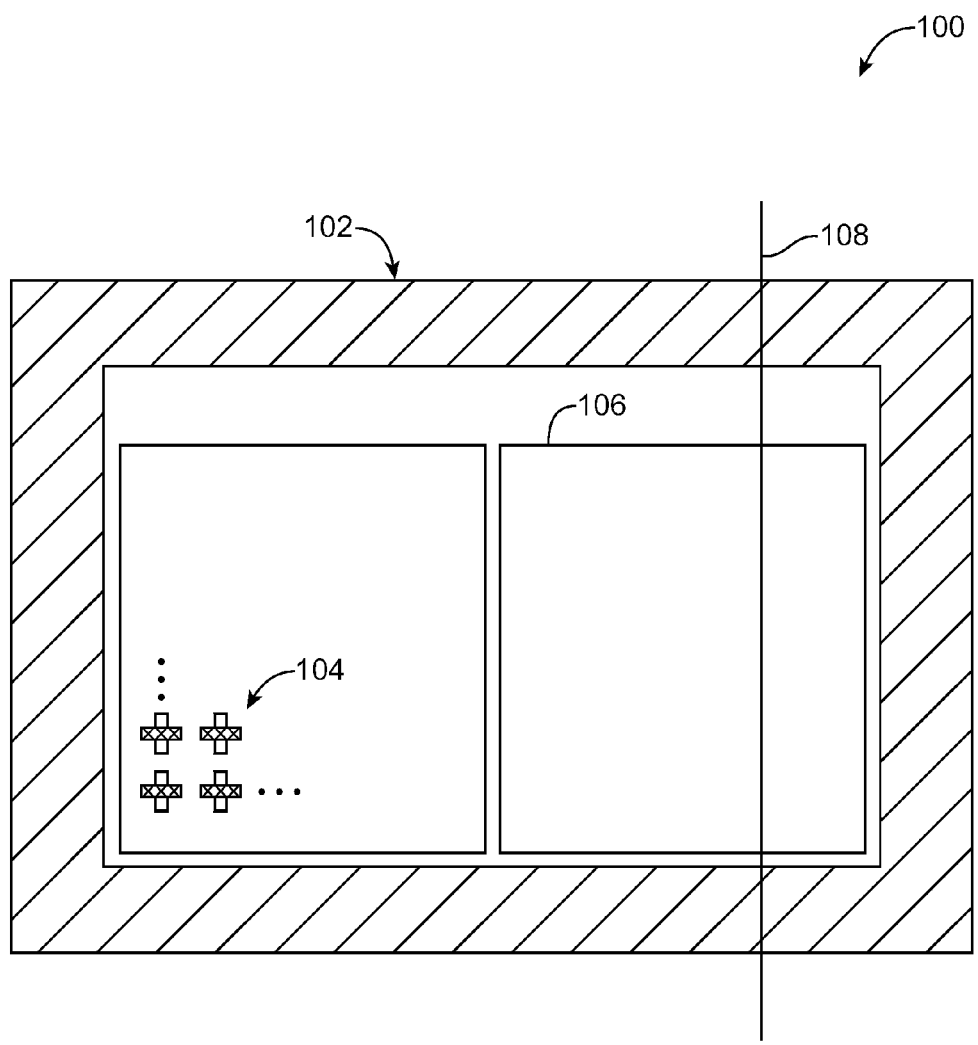
FIG. 2 is a top view of a conventional integrated circuit with a guard ring and separate decoupling capacitors.

A conventional integrated circuit 100 with a guard ring 102, power decoupling capacitors 104, and circuitry 106 is shown in FIG. 2. Guard ring 102 isolates circuitry 106 from external noise (i.e., noise from circuitry that is outside of the guard ring) and reduces the propagation of noise from circuitry 106 to external portions of the integrated circuit 100. Power decoupling capacitors 104 that are formed within the interior of ring 102 are used to stabilize positive and ground power supply voltages in integrated circuit 100.

Figure 3:
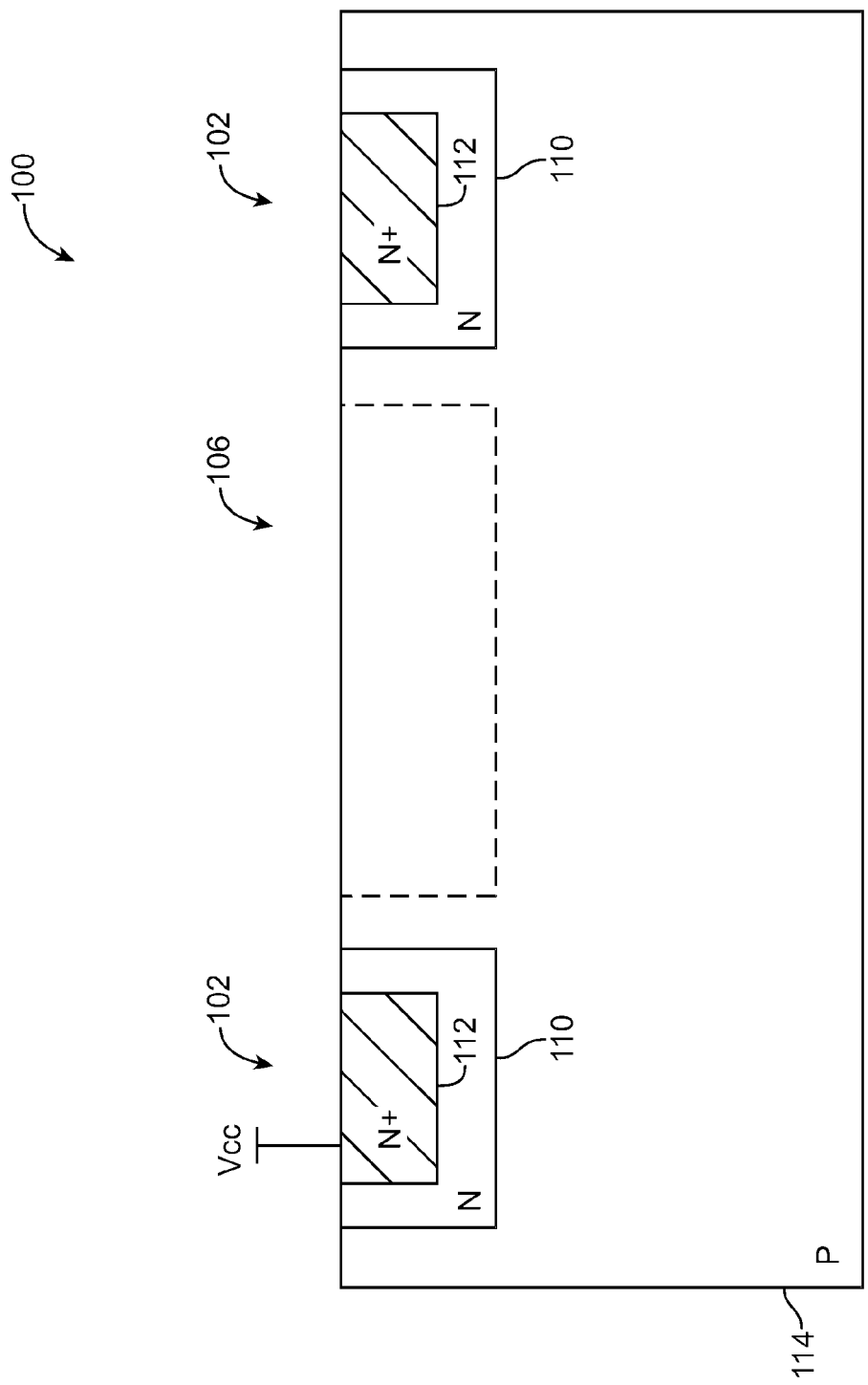
FIG. 3 is a cross-sectional side view of the conventional integrated circuit of FIG. 2.

A cross-sectional side view of integrated circuit 100 taken through line 108 in FIG. 2 is shown in FIG. 3. As shown in FIG. 3, guard ring 102 includes a doped region 110 and a highly doped region 112 within the doped region 110. The two doped regions 110 and 112 include dopant of the same type (e.g., the regions 110 and 112 both include n-type dopant or both include p-type dopant). In addition, the highly doped region 112 has a higher dopant concentration than the doped region 110.

Integrated circuit 100 has a substrate 114 that is doped with a dopant of opposite doping type to the dopant of guard ring 102. For example, when regions 110 and 112 are doped with n-type dopant, substrate 114 is doped with p-type dopant. When regions 110 and 112 are doped with p-type dopant, substrate 114 is doped with n-type dopant.

Substrate 114 and guard ring 102 are biased to create a reverse-biased p-n junction that provides isolation between circuitry 106 and external portions of integrated circuit 100. If the substrate 114 is a p-type substrate, guard ring 102 is doped with n-type dopant and biased with a positive power supply voltage (as shown in FIG. 3) while substrate 114 is biased with a ground power supply voltage. If the substrate 114 is an n-type substrate, guard ring 102 is doped with p-type dopant and biased with a ground power supply voltage while substrate 114 is biased with a positive power supply voltage.

With the conventional arrangement of FIGS. 2 and 3, power decoupling capacitors 104 take up valuable area inside guard ring 102, thereby limiting the available area for circuitry 106 and increasing the size and cost of integrated circuit 100.

Figure 4:
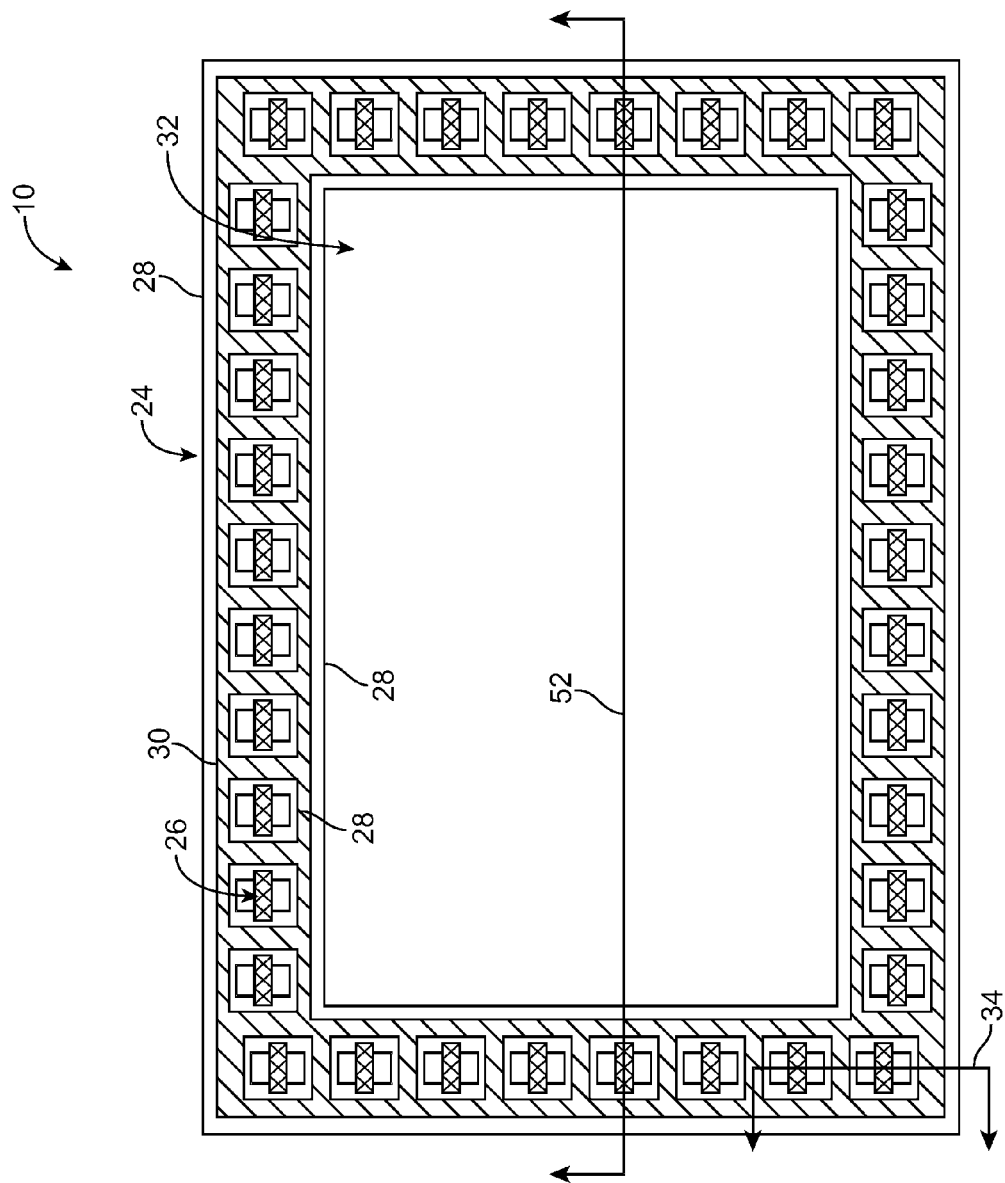
FIG. 4 is a top view of an illustrative integrated circuit that may include a guard ring with integrated capacitors in accordance with an embodiment of the present invention.

These and other limitations can be addressed using guard rings with integrated components such as power decoupling capacitors. FIG. 4 is a top view of an illustrative integrated circuit 10 that includes a guard ring 24 with integrated capacitors 26. If desired, integrated circuit 10 can include any desired number of guard rings with integrated capacitors such as guard ring 24 of FIG. 4.

Guard ring 24 may be formed from doped regions in the substrate of the integrated circuit 10. These doped regions may form a ring-like reverse-biased p-n junction around circuitry 32 that prevents noise from propagating through the substrate of integrated circuit 10 and interfering with the operation of circuitry 32 and other external circuits that share the substrate of the integrated circuit 10. Circuitry 32 may sometimes be referred to herein as core logic circuitry or logic circuitry. Circuitry 32 may include transistors, memory, programmable circuitry, capacitors, diodes, resistors, conductive pathways, and other suitable circuit elements.

Guard ring 24 may include a ring-like doped region 30 nested within another ring-like doped region 28. Region 30 may have a higher concentration of dopant than region 28. Region 30 may be connected to one or more power supply lines to bias regions 28 and 30 and form a reverse-biased p-n junction around circuitry 32. Integrated capacitors 26 may be located within region 28 (e.g., region 30 may include holes in which the capacitors 26 are formed).

In arrangements in which integrated circuit 10 includes a p-channel (i.e., p-type) substrate, region 28 may be an n-well and region 30 may be an n+ region that is formed within the n-well. If desired, capacitors 26 may be p-channel (i.e., p-type) transistors in arrangements in which the substrate of circuit 10 is p-type. N-wells such as region 28 may typically have a carrier concentration on the order of $10^{16}$ to $10^{18}$ cm$^{-3}$. N+ regions such as region 30 may have a carrier concentration on the order of $5 \times 10^{18}$ to $10^{19}$ cm$^{-3}$. These are merely illustrative examples and, in general, regions 28 and 30 may have any suitable dopant concentrations. In general, regions 28 and 30 may be doped using any number of dopants. N+ region 30 may be connected to one or more positive power supply lines supplying a positive power supply voltage Vcc, so that guard ring 24 forms a reverse-biased p-n junction.

Figure 5A:
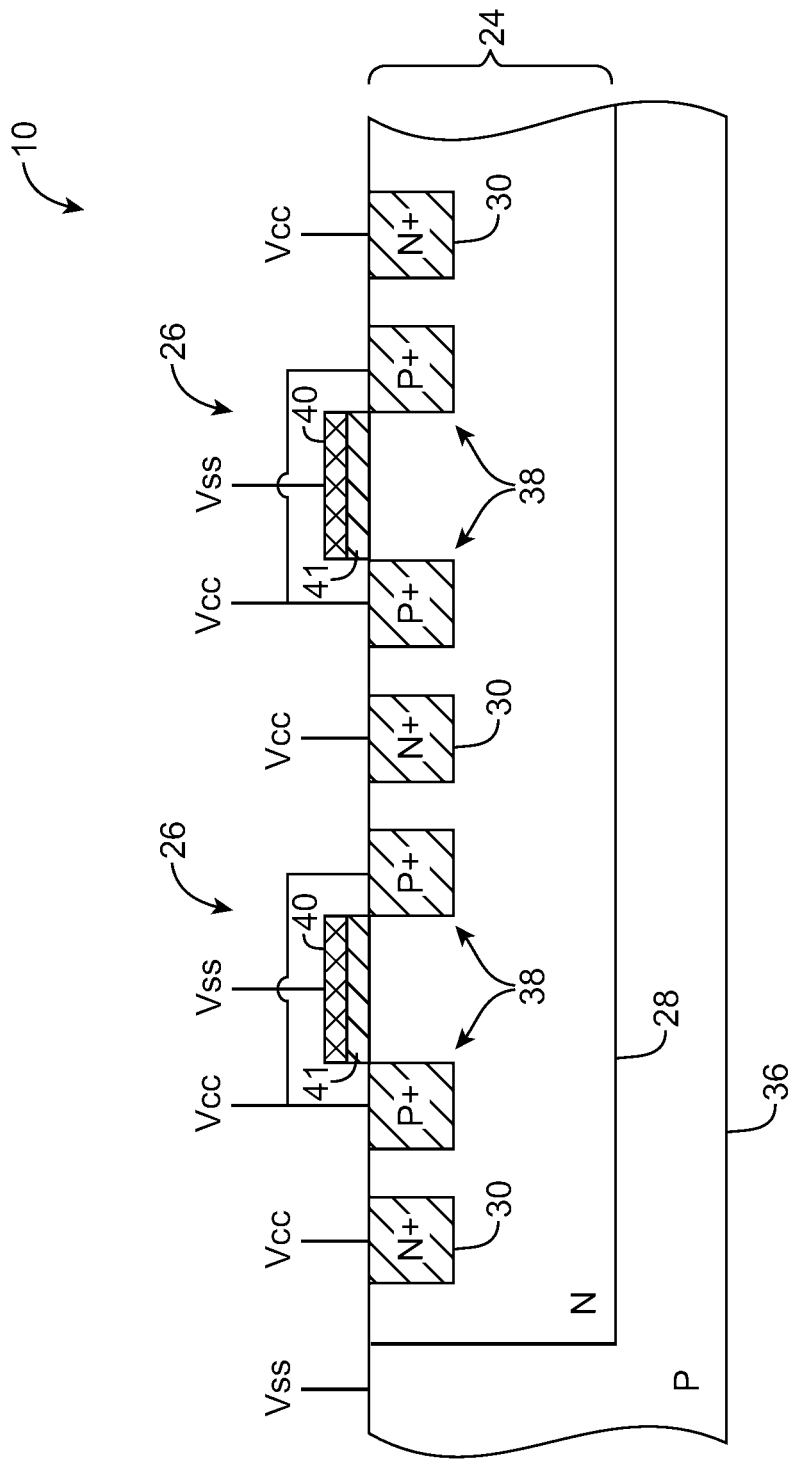
FIGS. 5A, 5B, and 5C are cross-sectional side views of illustrative guard rings with integrated capacitors such as the guard ring of the integrated circuit of FIG. 4 in accordance with various embodiments of the present invention.
Figure 5B:
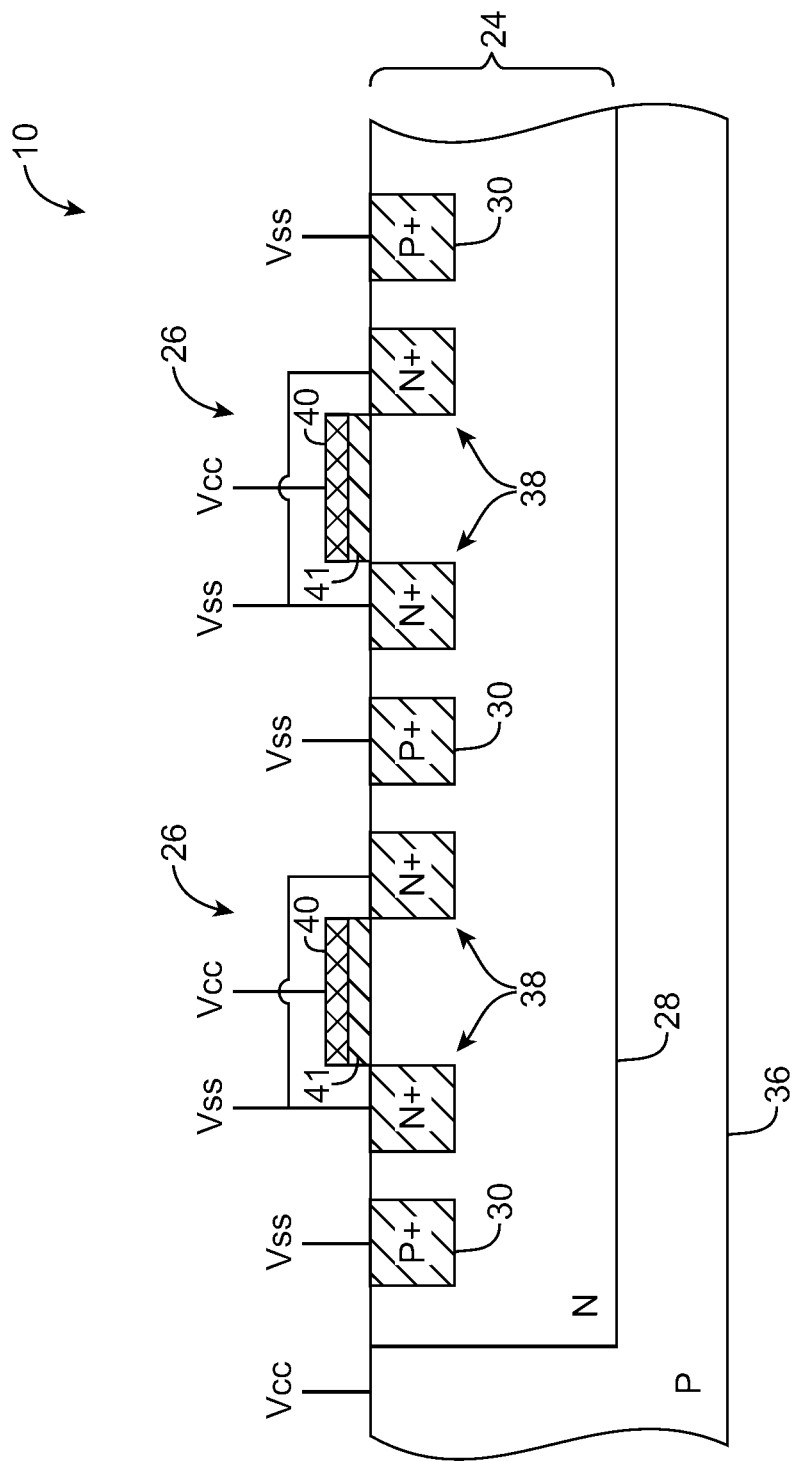
Figure 5C:
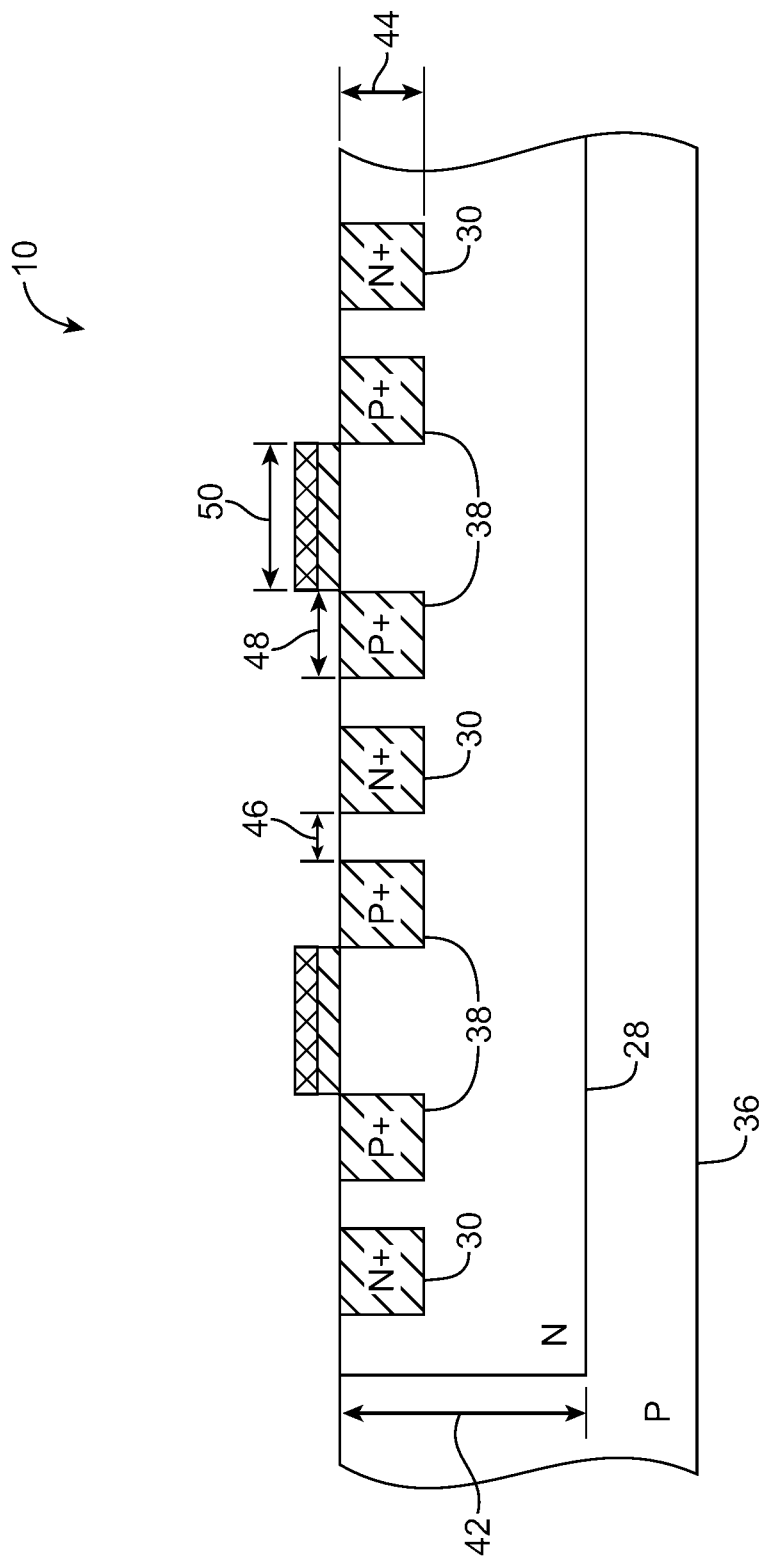

Cross-sectional views of guard ring 24 taken through line 34 of FIG. 4 are shown in FIGS. 5A, 5B, and 5C.

As shown in FIG. 5A, integrated circuit 10 may include substrate 36. Substrate 36 is a p-type substrate in the FIG. 5A example. In arrangements in which substrate 36 is p-type, region 30 may be formed from one or more n+ regions, region 28 may be formed from an n-well, and capacitors 26 may be formed with p-type source-drain regions (e.g., capacitors 26 may be formed from p-channel transistors).

N+ region 30 may be biased with a positive power supply voltage Vcc by one or more positive power supply lines and substrate 36 may be grounded (e.g., biased with a ground power supply voltage Vss, 0V, or other suitable ground voltage by a ground power supply line). With this type of arrangement, n-well 28 and the p-type substrate 36 form a ring-like reverse-biased p-n junction (i.e., guard ring 24).

Each of the capacitors 26 may include a pair of source-drain regions 38 that are doped with a p-type dopant and that are electrically connected together (i.e., are held at a common voltage). Gate terminal 40 (i.e., gate conductor 40) may be separated from n-well 28 and source-drain regions 38 by gate insulator 41. Gate insulator 41 may be formed from a material such as silicon oxide, a hafnium-based oxide, or any other suitable dielectric. Typical gate conductor thicknesses for gate conductor 40 are on the order of a thousand angstroms to several thousand angstroms. Typical gate insulator thicknesses for gate insulator 41 are on the order of 40 angstroms. As one example, gate insulator 41 may have a thickness of 20-500 angstroms. Source-drain regions 38 may be p+ regions and may have a charge carrier concentration on the order of $5\times10^{18}$ to $10^{19}$ cm$^{-3}$, as one example. In general, regions 38 may be doped using any suitable number of dopants.

With one suitable arrangement, n+ and/or p+ doped regions such as regions 30 and 38 may be doped with a dopant concentration that is sufficiently high such that the regions are considered degenerately doped.

Source-drain regions 38 form a first terminal for each of the capacitors 26. The first terminal of each of the capacitors 26 may be connected to one or more positive power supply lines that carry a positive power supply voltage Vcc. If desired, the first terminals of some or all of the capacitors 26 may also be connected together. Gate terminal 40 forms a second terminal for each of the capacitors 26. The second terminal of each of the capacitors 26 may be connected to one or more ground power supply lines that carry a ground power supply voltage Vss. If desired, the second terminals of some or all of the capacitors 26 may also be connected together. With this type of arrangement, each of the capacitors 26 serves as a power decoupling capacitor that stabilizes (limits rapid variations in and reduced noise in) the positive and ground power supply voltages Vcc and Vss.

As shown in FIG. 5B, integrated circuit 10 may include an n-type substrate 36. In arrangements in which substrate 36 is an n-type substrate, region 28 may be formed from a p-well, region 30 may be formed from one or more p+ regions, and capacitors 26 may be formed with n-type (n+) source-drain regions.

P+ region 30 may be biased with a ground power supply voltage Vss provided by one or more ground power supply lines and substrate 36 may be biased with a positive power supply voltage Vcc provided by one or more positive power supply lines. With this type of arrangement, the p-well 28 and the n-type substrate 36 form a ring-like reverse-biased p-n junction (i.e., guard ring 24).

As one example, the first terminal of each of the p-type capacitors 26 of FIG. 5B may be connected to one or more ground power supply lines that carry a positive power supply voltage Vss. The second terminal of each of the capacitors 26 of FIG. 5B may be connected to one or more positive power supply lines that carry a positive power supply voltage Vcc.

P-wells such as region 28 of FIG. 5B may have a carrier concentration on the order of $10^{16}$ to $10^{18}$ cm$^{-3}$. P+ regions such as region 30 of FIG. 5B may have a carrier concentration on the order of $5\times10^{18}$ to $10^{19}$ cm$^{-3}$. These are merely illustrative examples and, in general, p-type regions 28 and 30 may have any suitable dopant concentrations.

FIG. 5C illustrates various dimensions that may be associated with the structures of guard ring 24, regions 28 and 30, and capacitors 26.

As shown in FIG. 5C, region 28 may have a depth 42. For example, region 28 may have a depth 42 of less than 5 microns, approximately 5 microns, greater than 5 microns, or other suitable depths.

Region 30 and source-drain regions 38 may have a depth 44. For example, region 30 and source-drain regions 38 may have a depth 44 of less than 2 microns, approximately 2 microns, greater than 2 microns, or other suitable depths.

Region 30 and source-drain regions 38 may be separated by a gap distance 46 (e.g., a portion of region 28 may be interposed between source-drain regions 38 and region 30). For example, source-drain regions 38 and region 30 may be separate by a gap 46 of less than 0.2 microns, approximately 0.2 microns, greater than 0.2 microns, or other suitable distances parallel to the surface of circuit 10.

The source-drain regions 38 of each capacitor 26 may have a length 48. For example, regions 38 may have a length 48 of less than 0.5 microns, approximately 0.5 microns, greater than 0.5 microns, or other suitable lengths.

The gate terminal 40 of each capacitor 26 may have a length 50. For example, terminal 40 may have a length 50 of less than 1 micron, approximately 1 micron, greater than 1 micron, or other suitable lengths.

Figure 6A:
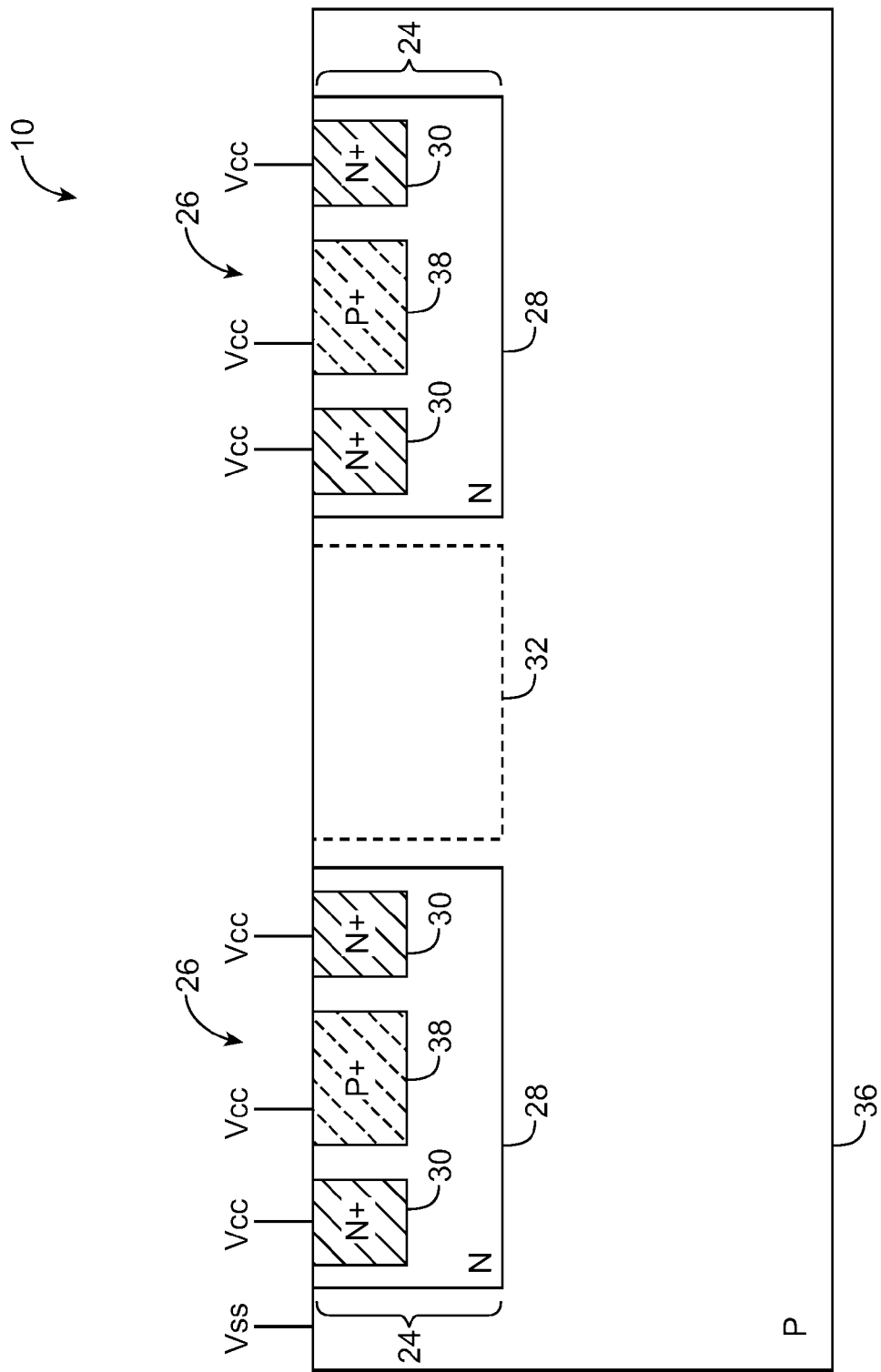
FIGS. 6A, 6B, and 6C are cross-sectional side views of illustrative integrated circuits that may include a guard ring with integrated capacitors such as the integrated circuit of FIG. 4 in accordance with various embodiments of the present invention.
Figure 6B:
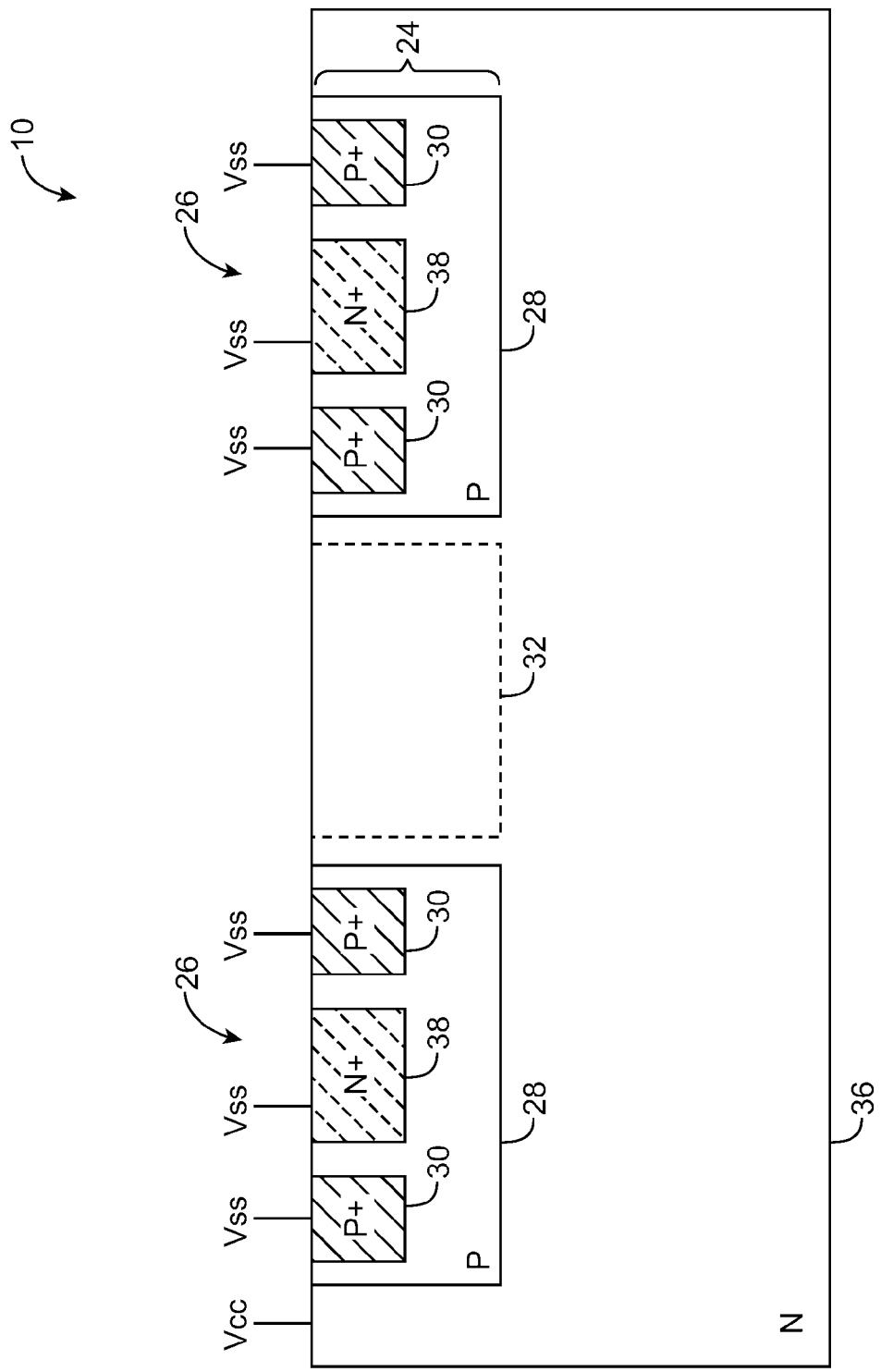
Figure 6C:
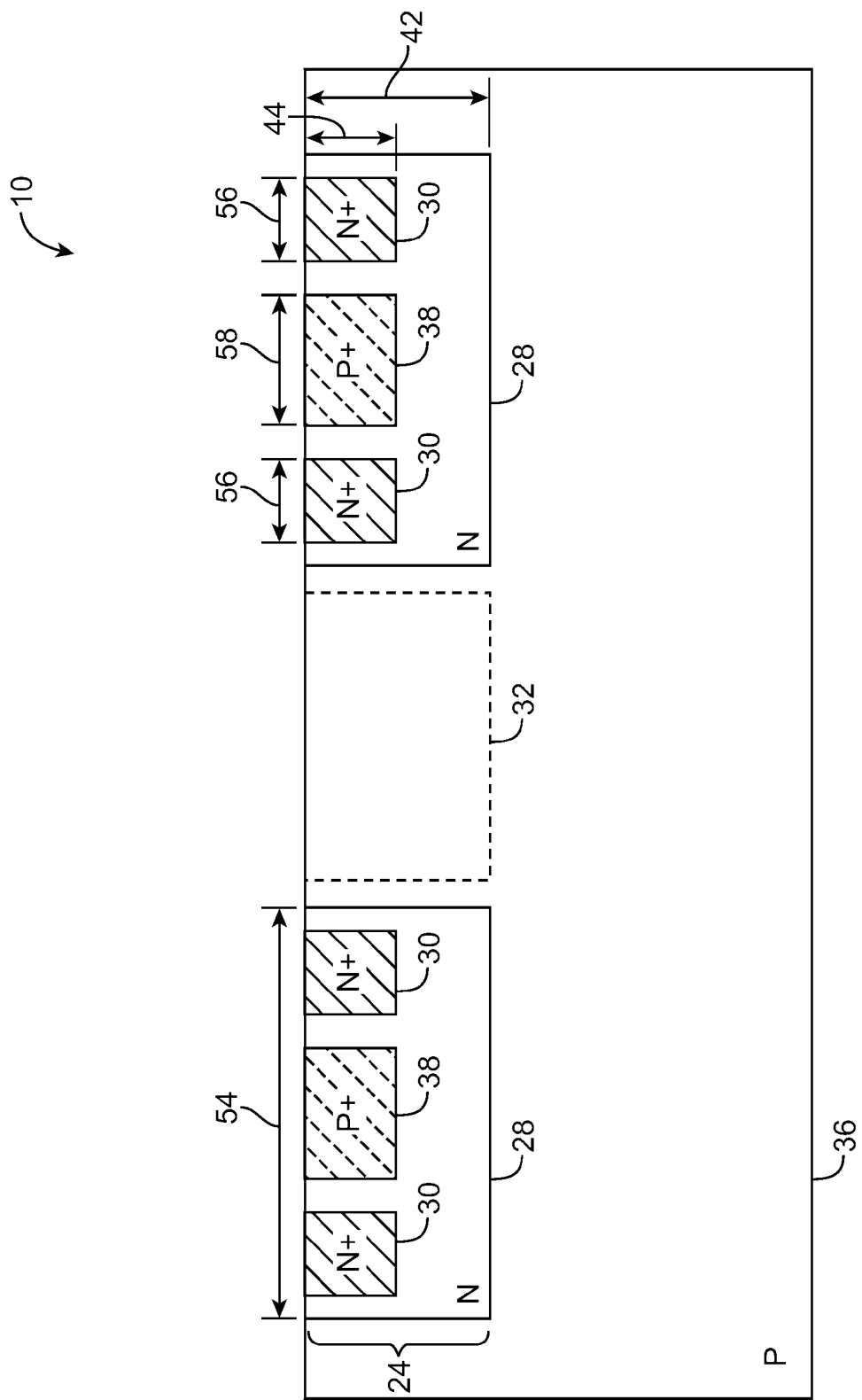

Cross-sectional views of guard ring 24 taken through line 52 in FIG. 4 are shown in FIGS. 6A, 6B, and 6C.

As with FIG. 5A, FIG. 6A illustrates how integrated circuit 10 may include a p-type substrate 36. In these arrangements, guard ring 24 may include n-well 28, n+ region 30, and capacitors 26 formed with p-type source-drain regions 38. FIG. 6A also shows how guard ring 28 surrounds circuitry 32 of integrated circuit 10. FIG. 6A, and the other figures herein, are not to scale. Circuitry 32 may be significantly larger (e.g., wider in the FIG. 6A perspective) than guard ring 28.

As with FIG. 5B, FIG. 6B illustrates that integrated circuit 10 may include an n-type substrate 36. In these arrangements, guard ring 24 may include p-well 28, p+ region 30, and capacitors 26 formed with n-type source-drain regions 38.

FIG. 6C illustrates various dimensions of guard ring 24, regions 28 and 30, and capacitors 26.

As shown in FIG. 6C, guard ring 24 may have a width 54. For example, guard ring 24 may have a width 54 of less than 12 microns, approximately 12 microns, greater than 12 microns, or other suitable widths.

Region 30 may have a width 56. For example, region 30 may have a width 56 of less than 2 microns, approximately 2 microns, greater than 2 microns, or other suitable widths.

Source-drain regions 38 (and gate terminals 40) may have widths 58. For example, regions 38 may have widths 58 of less than 5 microns, approximately 5 microns, greater than 5 microns, or other suitable widths.

The positive and ground power supply signals Vcc and Vss applied to region 30 and the source-drain regions 38 and gate conductors 40 of guard ring 24 may be provided using any suitable number of power supply lines. With one suitable arrangement, two or more ring-shaped concentric power supply lines are formed above guard ring 24 (e.g., above region 30 and the capacitors 26). With this type of arrangement, vias at periodic locations can connect the concentric power supply lines to region 30 and capacitors 26 to provide the signals Vcc and Vss to region 30 and capacitors 26. In addition, because the power supply lines are parallel, the power supply lines form one or more parallel plate capacitors that have terminals connected to the signals Vcc and Vss, thereby contributing additional power stabilization to the integrated circuit 10 (e.g., the power supply lines provide additional power decoupling).

Figure 7:
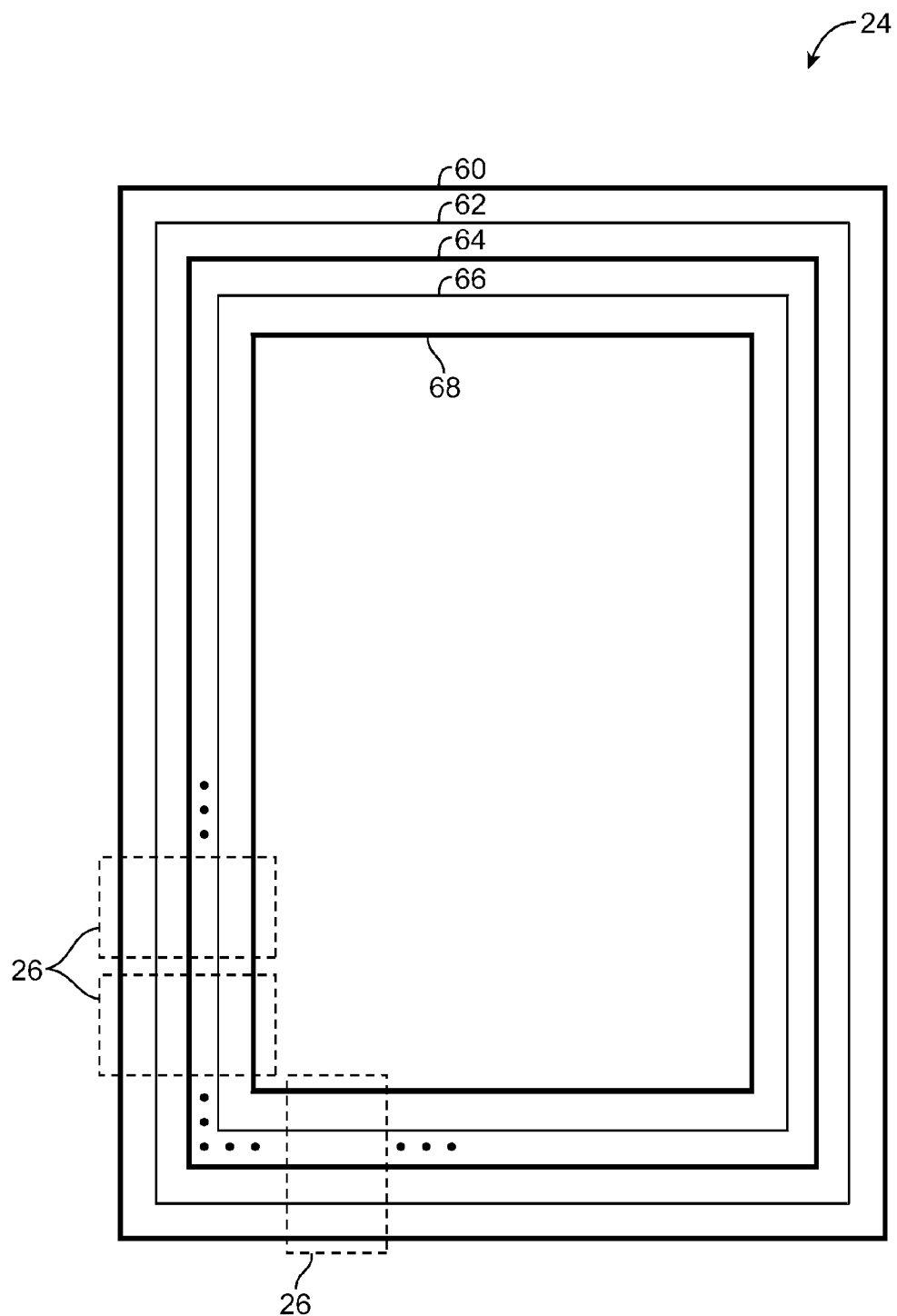
FIG. 7 is a top view of an illustrative guard ring with integrated capacitors that may include alternating power lines in an integrated circuit in accordance with an embodiment of the present invention.

This type of arrangement is illustrated in FIG. 7, which shows a top view of power lines that may be provided in a guard ring 24. In the arrangement of FIG. 7, guard ring 24 includes five power lines arranged in a concentric alternating-polarity pattern. This is merely illustrative and, in general, guard ring 24 may include any suitable number of power lines. By arranging the power lines in a concentric alternating pattern, the capacitance between the power lines (i.e., between respective concentric power line rings that are at different voltages) may be increased.

As shown in FIG. 7, guard ring 24 may include power supply lines 60, 62, 64, 66, and 68, as examples. In arrangements in which substrate 36 is p-type, power supply lines 60, 64, and 68 may be positive power supply lines and power supply lines 62 and 66 may be ground power supply lines. In arrangements in which substrate 36 is n-type, power supply lines 60, 64, and 68 may be ground power supply lines and power supply lines 62 and 66 may be positive power supply lines. These power supply lines may be connected to the capacitors 26 of guard ring 24 and to region 30 of guard ring 24 (and, if desired, to region 28 of guard ring 24) to supply voltages Vss and Vcc.

Figure 8:
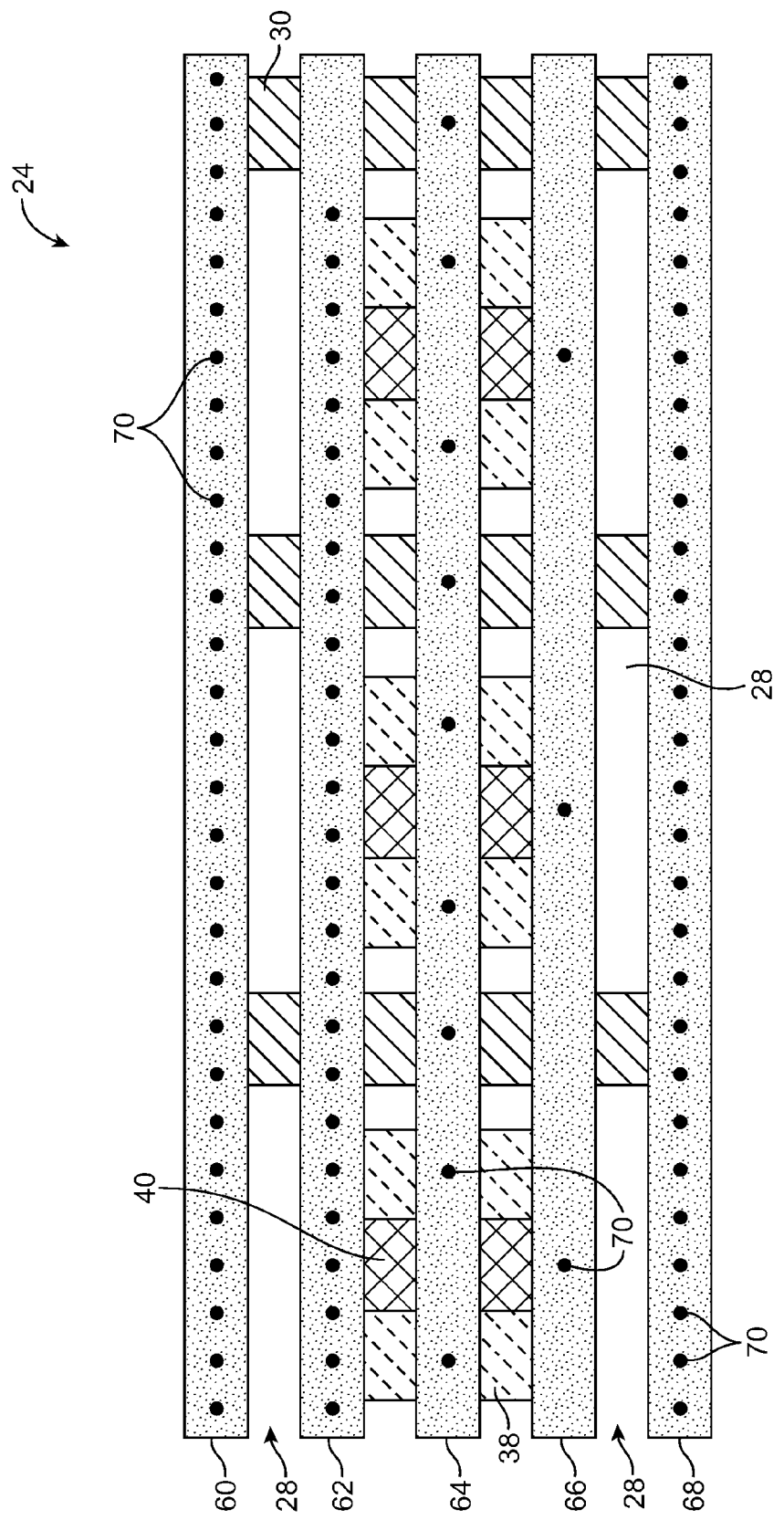
FIG. 8 is a close-up top view of an illustrative portion of the guard ring that has integrated capacitors and the alternating power lines of FIG. 7 in accordance with an embodiment of the present invention.

A close up view of an illustrative portion of a guard ring 24 with concentric power lines of the type shown in FIG. 7 is shown in FIG. 8. The power lines are illustrated as the speckled regions of FIG. 8. Region 28 is illustrated as the un-speckled and un-hatched regions of FIG. 8 (i.e., the white regions of FIG. 8). Region 30 is illustrated as the solid-hatched regions of FIG. 8. Source-drain regions 38 of capacitors 26 are illustrated as the dash-hatched regions of FIG. 8. Gate conductors 40 are illustrated as the cross-hatched regions of FIG. 8. Region 30 may extend beneath some or all of the power supply lines 60 and 68 in the FIG. 8 examples. For example, region 30 may extend beneath all of power lines 60 and 68 and portions of power line 64.

As shown in FIG. 8, power supply lines 60, 64, and (e.g., positive power supply lines in arrangements in which substrate 36 is p-type) may be connected to region 30 via multiple vias 70 (i.e., vertical conductive plugs).

Power supply line 64 may be connected to the source-drain regions 38 of the capacitors 26 by one or more vias 70 (e.g., one or more vias may connect each of the source-drain regions 38 to line 64). If desired, power supply line 64 may also be connected to region 30 by multiple vias.

Power supply lines 62 and 66 may be connected to the gate conductor 40 of the capacitors 26 by one or more vias 70.

Figure 9:
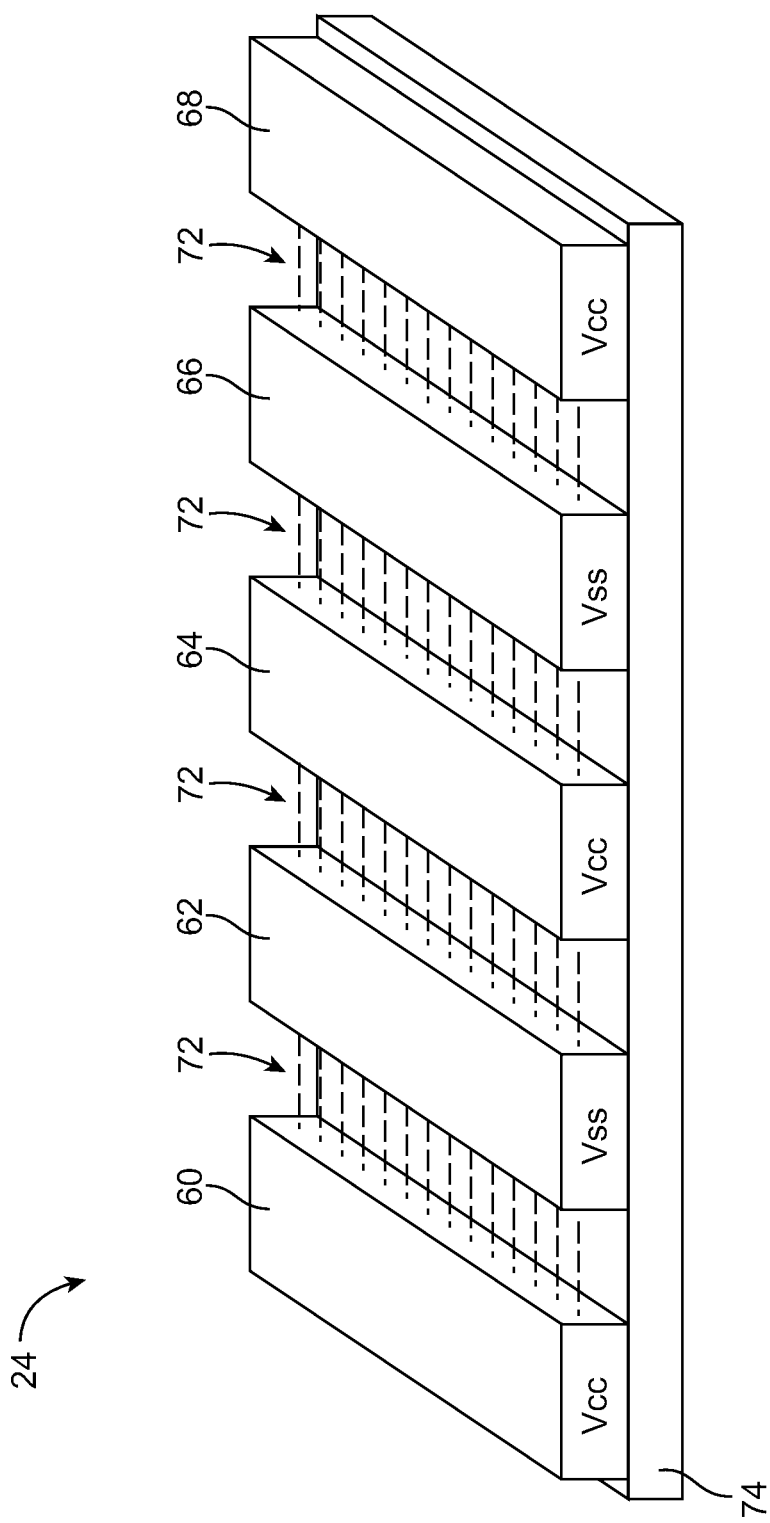
FIG. 9 is a perspective view of an illustrative portion of the alternating power lines and the guard ring that has integrated capacitors of FIG. 7 in accordance with an embodiment of the present invention.

A perspective view of the power lines of FIGS. 7 and 8 is shown in FIG. 9. As shown in FIG. 9, guard ring 24 may be formed in a layer 74 that includes region 28, region 30, source-drain regions 38, and gate conductors 40. The power lines 60, 62, 64, 66, and 68 may lie in a plane above layer 74 (as one example) and may connect to layer 74 via multiple vias 70 (as shown in FIG. 8). Because the power lines carry different (i.e., alternating ground and positive voltages), power lines 60, 62, 64, 66, and 68 form multiple parallel plate capacitors due to the buildup of electric field lines 72 between the conductive lines. The capacitance of the power lines contributes to power stability. If desired, the capacitance of the alternating power supply lines may allow the number and/or size of other power decoupling capacitors such as capacitors 26 (or power decoupling capacitors in circuitry 32) to be reduced or, for a given size of power decoupling capacitor, may make the decoupling process more effective by increasing the total decoupling capacitance between the Vss and Vcc lines.

The foregoing is merely illustrative of the principles of this invention and various modifications can be made by those skilled in the art without departing from the scope and spirit of the invention. The foregoing embodiments may be implemented individually or in any combination.

What is claimed is:

1. A guard ring in a substrate, comprising:
  a first doped region within the substrate, wherein the first doped region is of a first doping type; and
  a plurality of capacitors having terminals within the first doped region of a second doping type that is opposite to the first doping type, wherein the substrate is of the second doping type.

2. The guard ring defined in claim 1 wherein the first doping type is n-type and wherein the terminals comprise p-type dopant.

3. The guard ring defined in claim 1 wherein the first doping type is p-type and wherein the terminals comprise n-type dopant.

4. The guard ring defined in claim 1 further comprising a second doped region that has a first concentration of dopant of the first doping type, wherein the first doped region has a second concentration of dopant of the first doping type that is less than the first concentration of dopant.

5. The guard ring defined in claim 4 wherein at least some of the first doped region is interposed between the second doped region and the terminals of the capacitors.

6. The guard ring defined in claim 5 wherein at least some of the first doped region surrounds the second doped region.

7. The guard ring defined in claim 4 wherein the first and second doped regions comprise p-type dopant and wherein the terminals comprise n-type dopant.

8. The guard ring defined in claim 4 wherein the first and second doped regions comprise n-type dopant and wherein the terminals comprise p-type dopant.

9. The guard ring defined in claim 4 further comprising:
  first and second concentric ring-shaped conductive lines each of which lies within the first doped region, wherein the first conductive line is coupled to the plurality of capacitors, wherein the second conductive line is coupled to the second doped region and the plurality of capacitors, and wherein the concentric ring-shaped conductive lines comprise at least one parallel-plate capacitor.

10. The guard ring defined in claim 4, wherein the plurality of capacitors comprises a first plurality of capacitors, the guard ring further comprising:
  first, second, third, fourth, and fifth concentric ring-shaped conductive lines each of which lies within the first doped region, wherein:
    the first, third, and fifth conductive lines convey a first power supply voltage;
    the second and fourth conductive lines convey a second power supply voltage that is different than the first power supply voltage;
    the second conductive line is interposed between the first and third conductive line; and
    the fourth conductive line is interposed between the third and fifth conductive line, wherein the concentric ring-shaped conductive lines comprise a second plurality of capacitors and wherein the first and second pluralities of capacitors are coupled together in parallel.

11. The guard ring defined in claim 10 wherein:
  the first conductive line is coupled to the second doped region;
  the second conductive line is coupled to gate terminals in each of the capacitors;
  the third conductive line is coupled to the terminals of the capacitors and to the second doped region;
  the capacitors further comprise gate terminals;
  the fourth conductive line is coupled to the gate terminals of the capacitors; and
  the fifth conductive line is coupled to the second doped region.

12. A guard ring, comprising:
  a guard ring region;
  a plurality of capacitors that lie in a first common plane in the guard ring region; and
  at least first, second, and third concentric ring-shaped conductive lines each of which lies within the guard ring region and is coupled to the plurality of capacitors, wherein the first and third conductive lines carry a first power supply voltage, wherein the second conductive line carries a second power supply voltage that is different from the first power supply voltage, wherein the first, second, and third conductive lines lie in a second common plane substantially parallel to and above the first common plane, and wherein the second conductive line is disposed between the first and second conductive lines.

13. The guard ring defined in claim 12 wherein the guard ring region comprises:
   a first doped region that has a first concentration of dopant of a first doping type; and
   a second doped region formed within the first doped region and having a second concentration of dopant of the first doping type, wherein the second concentration of dopant is greater than the first concentration of dopant.

14. The guard ring defined in claim 13 wherein each of the capacitors has a first terminal formed from source-drain regions and a second terminal and wherein at least some of the first doped region is interposed between the second doped region and the source-drain terminals.

15. The guard ring defined in claim 14 wherein the source-drain regions are of a second doping type that is opposite to the first doping type.

16. The guard ring defined in claim 15 wherein the first and second doped regions comprise n-type dopant and wherein the source-drain regions comprise p-type dopant.

17. The guard ring defined in claim 16 wherein the first power supply voltage is a positive power supply voltage, wherein the second power supply voltage is a ground power supply voltage, wherein the second terminal of each of the capacitors is formed from a gate, wherein the first conductive line couples the positive power supply voltage to a first plurality of the source-drain terminals and to first portions of the second doped region, wherein the second conductive line couples the ground power supply voltage to the gate of each of the capacitors, and wherein the third conductive line couples the positive power supply voltage to a second plurality of the source-drain terminals and to second portions of the second doped region.

18. A guard ring, comprising:
   a first doped region that has a first concentration of dopant;
   a plurality of capacitors within the first doped region each of which has a first terminal formed from source-drain regions and has a second terminal; and
   a second doped region that has a second concentration of dopant that is greater than the first concentration of dopant, wherein at least some of the first doped region is interposed between the second doped region and the source-drain regions.

19. The guard ring defined in claim 18 wherein the source-drain regions have a third concentration of dopant that is greater than the first concentration of dopant.

20. The guard ring defined in claim 18 wherein the first doped region includes dopant of a first doping type and wherein the second doped region includes dopant of the first doping type.

21. The guard ring defined in claim 20 wherein the source-drain regions include dopant of a second doping type that is opposite to the first doping type.

22. The guard ring defined in claim 21 wherein the first doping type is n-type and wherein the source-drain regions comprise p-type dopant.

23. The guard ring defined in claim 21 wherein the first doping type is p-type and wherein the source-drain regions comprise n-type dopant.

24. The guard ring defined in claim 18 further comprising:
   first and second concentric ring-shaped conductive lines each of which lies within the first doped region and is coupled to the plurality of capacitors, wherein the concentric ring-shaped conductive lines comprise at least one parallel-plate capacitor and wherein the parallel-plate capacitor and the plurality of capacitors are coupled together in parallel.

25. The guard ring defined in claim 18, wherein the plurality of capacitors comprises a first plurality of capacitors, the guard ring further comprising:
   first, second, third, fourth, and fifth concentric ring-shaped conductive lines each of which lies within the first doped region, wherein:
      the first, third, and fifth conductive lines convey a positive power supply voltage;
      the second and fourth conductive lines convey a ground power supply voltage;
      the second conductive line is interposed between the first and third conductive line; and
      the fourth conductive line is interposed between the third and fifth conductive line, wherein the concentric ring-shaped conductive lines comprise a second plurality of capacitors and wherein the first and second pluralities of capacitors are coupled together.

26. The guard ring defined in claim 12 wherein the concentric ring-shaped conductive lines comprise at least one parallel-plate capacitor and wherein the parallel-plate capacitor and the plurality of capacitors are coupled together in parallel.

* * * * *